United States Patent
Lin et al.

(10) Patent No.: US 9,362,153 B2
(45) Date of Patent: Jun. 7, 2016

(54) METHOD FOR ALIGNING SUBSTRATES IN DIFFERENT SPACES AND HAVING DIFFERENT SIZES

(71) Applicant: METAL INDUSTRIES RESEARCH&DEVELOPMENT CENTRE, Kaohsiung (TW)

(72) Inventors: Chorng-Tyan Lin, Kaohsiung (TW); Chih-Chin Wen, Hsinchu (TW); Chun-Ming Yang, Kaohsiung (TW); Shi-Wei Lin, Kaohsiung (TW)

(73) Assignee: METAL INDUSTRIES RESEARCH&DEVELOPMENT CENTRE, Kaohsiung (TW)

( * ) Notice: Subject to any disclaimer, the term of this patent is extended or adjusted under 35 U.S.C. 154(b) by 372 days.

(21) Appl. No.: 14/162,093

(22) Filed: Jan. 23, 2014

(65) Prior Publication Data
US 2015/0205216 A1    Jul. 23, 2015

(51) Int. Cl.
*H01L 21/00* (2006.01)
*H01L 21/68* (2006.01)
*H01L 21/67* (2006.01)

(52) U.S. Cl.
CPC ........ *H01L 21/681* (2013.01); *H01L 21/67092* (2013.01)

(58) Field of Classification Search
None
See application file for complete search history.

(56) References Cited

U.S. PATENT DOCUMENTS

| | | | | |
|---|---|---|---|---|
| 4,742,376 A | * | 5/1988 | Phillips | ................. G03F 9/7026 355/43 |
| 7,946,669 B2 | | 5/2011 | Oh et al. | |

FOREIGN PATENT DOCUMENTS

| | | |
|---|---|---|
| TW | I288365 | 10/2007 |
| TW | 201324668 A1 | 6/2013 |

* cited by examiner

*Primary Examiner* — Seahvosh Nikmanesh
(74) *Attorney, Agent, or Firm* — WPAT, PC; Justin King

(57) ABSTRACT

A method for aligning substrates in different spaces and having different sizes includes: capturing actual local images of two substrates; comparing specific marks in standard local feature regions of the two substrates, and obtaining specific marks in actual local feature regions of the two substrates; separately establishing actual coordinate systems of the two substrates to synthesize aligned assembly coordinate system; comparing coordinate values of the specific marks of the two substrates in the two actual coordinate systems to obtain first group of offsets, and comparing sizes of the two substrates to obtain a size difference; using the first group of offsets and the size difference to correct coordinate values of specific marks of one of the two substrates; comparing coordinate values of the specific marks of the two substrates, to obtain second group of offsets; and moving the one to a position compensated by the second group of offsets.

9 Claims, 12 Drawing Sheets

METHOD FOR ALIGNING SUBSTRATES IN DIFFERENT SPACES AND HAVING DIFFERENT SIZES

BACKGROUND

1. Technical Field

The present invention relates to a method for aligning substrates in different spaces and having different sizes, and in particular to a method for aligning substrates in different spaces and having different sizes, wherein the aligning method is applicable to the alignment of two substrates that have different sizes are in different waiting spaces, and have specific marks or specific shapes.

2. Related Art

A typical application of a double-layer board alignment technology is glass photomask precise alignment. In addition, the double-layer board alignment technology is widely applied to, for example, the semiconductor industry, flat panel display industry, and printed circuit board industry. Photomask precise alignment is a key technology of various exposure machines in the aforementioned electronic industries, and to reduce the manufacturing cost by mastering the key technology is very helpful in improving international competitiveness.

The U.S. Pat. No. 7,946,669 discloses an inserted-type aligning apparatus, which mainly includes step of: inserting two charge coupled devices (CCDs) into a double-layer substrate at the same time, capturing images of upper and lower aligning marks, and then performing alignment. The two CCDs need to be calibrated in a single coordinate space. Therefore, the alignment of this aligning apparatus belongs to the spatial alignment of images captured in a single coordinate space.

The TW patent (patent number: TW 1288365) discloses a double-layer substrate alignment apparatus for meeting a high-precision alignment requirement, wherein the aligning method mainly includes steps of: placing two CCDs above a double-layer substrate, capturing images of two groups of non-overlapping upper and lower alignment marks at the same time, and performing precise alignment after spatial calculation. The two CCDs also need to be calibrated in a single coordinate space. Therefore, the alignment of this aligning apparatus also belongs to the spatial alignment of images captured in a single coordinate space.

In the prior art, all alignment is performed by overlapping images of the alignment marks and performing calculation in a single coordinate space, and only substrates having identical sizes can be aligned.

However, during processes of some high-tech industries, due to specificity of materials, images of aligned substrates having different sizes cannot be often aligned in the same image capturing unit when attachment, combination, or assembly is performed with the image visual assistance. For example, in the touch panel industry, touch panels have an attachment process which involves multiple layers of different types and having different sizes, so sometimes the overlapping-type alignment mark design is inapplicable.

Therefore, it is necessary to provide a method for aligning substrates in different spaces and having different sizes, so as to solve the foregoing problem.

SUMMARY

The present invention is directed to a method applicable to alignment of two substrates that have different sizes, are in different waiting spaces, and have specific marks or specific shapes.

To achieve the foregoing objective, the present invention provides an method for aligning substrates in different spaces and having different sizes, comprising following steps of: capturing at least two actual local images of each of two substrates in a first waiting space and a second waiting space and having different sizes by using two calibrated image capturing units in the first waiting space and two calibrated image capturing units in the second waiting space; separately making comparison with specific marks or specific shapes in standard local feature regions of each of the two substrates, and obtaining specific marks or specific shapes in at least two actual local feature regions of each of the two substrates; separately establishing actual coordinate systems of the two substrates so as to synthesize an aligned assembly coordinate system; comparing coordinate values of the specific marks or specific shapes of the two substrates in the two actual coordinate systems so as to obtain a first group of offsets, and comparing sizes of the two substrates so as to obtain a size difference; correcting coordinate values of specific marks or specific shapes of one of the two substrates by using the first group of offsets and the size difference; comparing the corrected coordinate values of the specific marks or specific shapes of the one of the two substrates in the two actual coordinate systems with coordinate values of specific marks or specific shapes of the other one of the two substrates, so as to obtain a second group of offsets; moving the one of the two substrates to a position compensated by the second group of offsets; moving the one in the two substrates from the first waiting space to an aligned assembly space by using a first predetermined amount of movement; and moving the other one of the two substrates from the second waiting space to the aligned assembly space by using a second predetermined amount of movement.

The aligning method according to the present invention is applicable to alignment of two substrates, with or without marks, in different waiting spaces and having different sizes. When two substrates are located in different waiting spaces, coordinate values of the specific marks (or specific shapes) of the two substrates are subsequently calculated by using specific marks (or specific shapes) of actual local feature regions of the two substrates. Coordinate values of specific marks (or specific shapes) of one substrate of the two substrates are corrected, so that the two substrates having different sizes are taken as two substrates having identical sizes by means of simulation. Then, the deviation of the alignment of the substrates in different spaces and having different sizes is compensated and corrected, and a post process (such as attachment or assembly) is performed subsequently. It is unnecessary to establish a complex transformation relationship between an image coordinate system and an aligned coordinate system, and therefore mathematic calculations can be reduced by a great degree, a device debugging time can be reduced, and an aligned attachment process can be more flexible.

In order to make the aforementioned and other objectives, features, and advantages of the present invention clearer, embodiments accompanied with figures are described in detail below.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

In order to make the aforementioned and other objectives, features, and advantages of the present invention clearer, a preferred embodiment of the present invention is described in detail below with reference to the accompanying drawings. Moreover, the directional terms mentioned in the present invention, like "above," "below," "front," "back," "left," "right," "inner," "outer," or "lateral," refer to the directions in the appended drawings. Therefore, the directional terms are only used for illustration and comprehension but they do not limit the present invention.

Figure 1A:
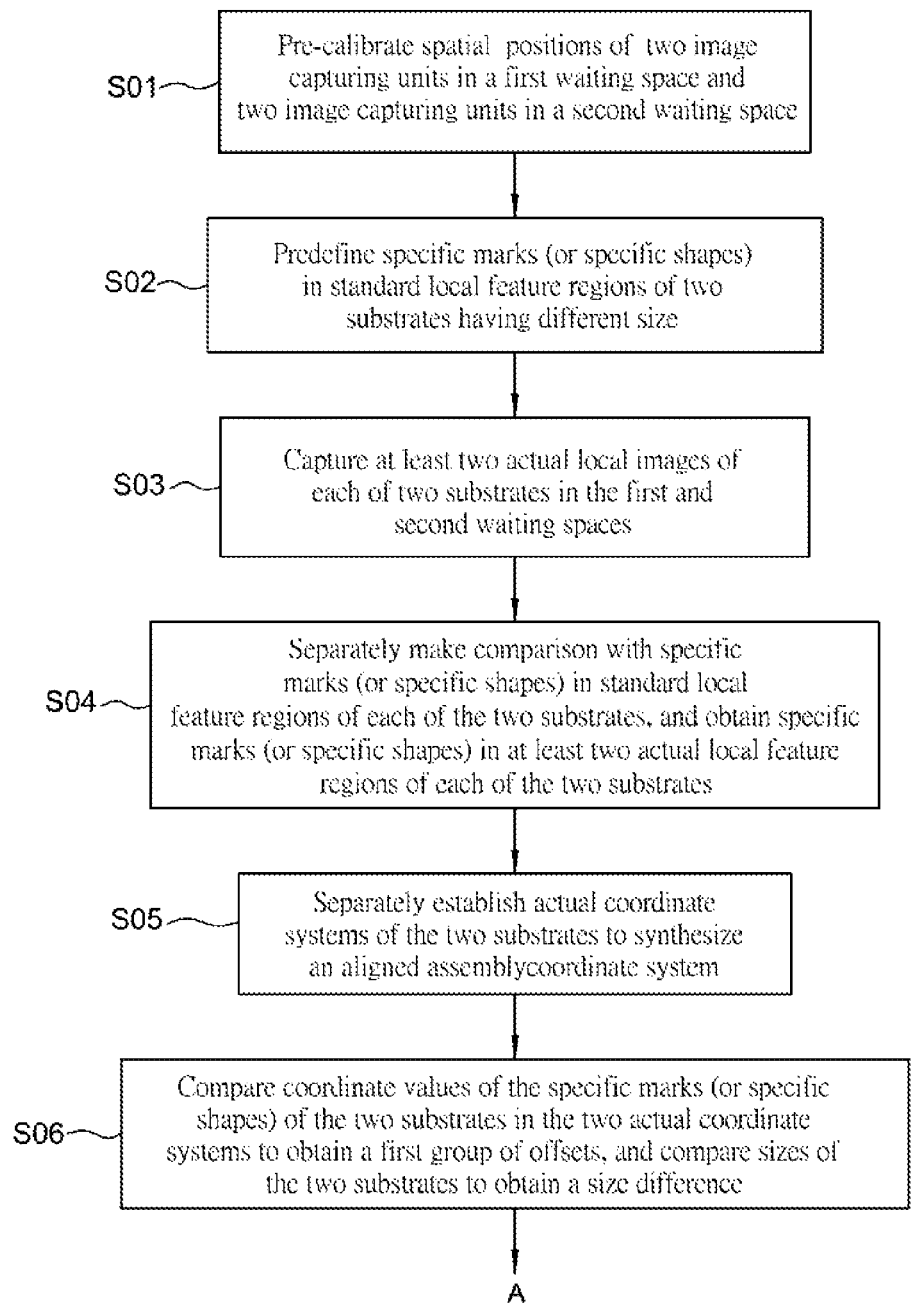
FIG. 1a and FIG. 1b are a flow chart of a method for aligning substrates in different spaces and having different sizes according to an embodiment of the present invention.
Figure 1B:
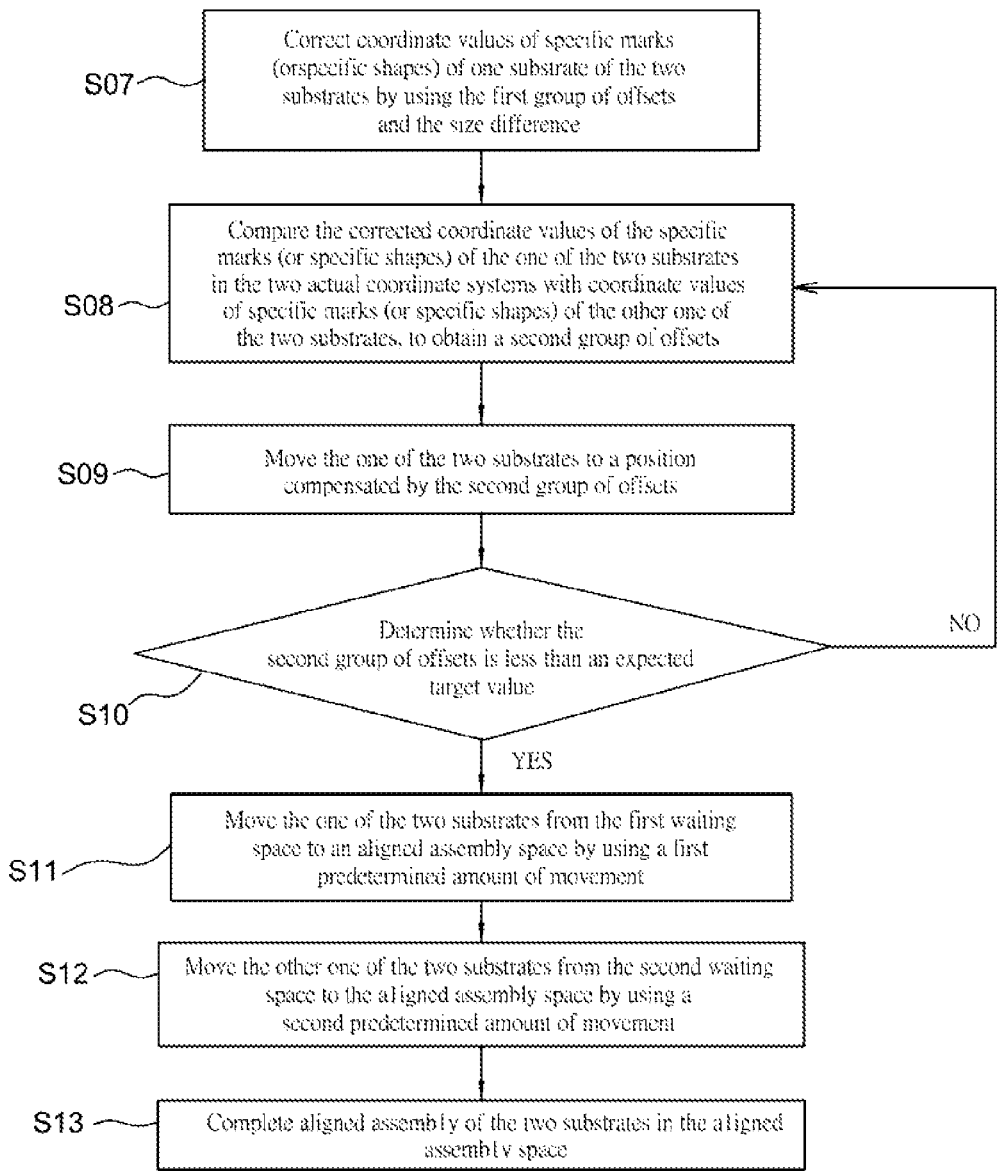

FIG. 1a and FIG. 1b are a flow chart of a method for aligning substrates in different spaces and having different sizes according to an embodiment of the present invention. The aligning method includes following steps: Step (S01): Pre-calibrate spatial positions of two image capturing units in a first waiting space and two image capturing units in a second waiting space. Step (S02): Predefine specific marks (or specific shapes) in standard local feature regions of two substrates having different sizes by using the two calibrated image capturing units in the first waiting space and the two calibrated image capturing units in the second waiting space. Step (S03): Capture at least two actual local images of each of two substrates in the first and second waiting spaces by using the two calibrated image capturing units in a first waiting space and the two calibrated image capturing units in a second waiting space. Step (S04): Separately make comparison with specific marks (or specific shapes) in standard local feature regions of each of the two substrates, and obtain specific marks (or specific shapes) in at least two actual local feature regions of each of the two substrates. Step (S05): Separately establish actual coordinate systems of the two substrates so as to synthesize an aligned assembly coordinate system. Step (S06): Compare coordinate values of the specific marks (or specific shapes) of the two substrates in the two actual coordinate systems so as to obtain a first group of offsets, and compare sizes of the two substrates so as to obtain a size difference. Step (S07): Correct coordinate values of specific marks (or specific shapes) of one of the two substrates by using the first group of offsets and the size difference. Step (S08): Compare the corrected coordinate values of the specific marks (or specific shapes) of the one of the two substrates in the two actual coordinate systems with coordinate values of specific marks (or specific shapes) of the other one of the two substrates, so as to obtain a second group of offsets. Step (S09): Move the one of the two substrates to a position compensated by the second group of offsets. Step (S10): Determine whether the second group of offsets is less than an expected target value. Step (S11): Move the one of the two substrates from the first waiting space to an aligned assembly space by using a first predetermined amount of movement. Step (S12): Move the other one of the two substrates from the second waiting space to the aligned assembly space by using a second predetermined amount of movement. Step (S13): Complete aligned assembly of the two substrates in the aligned assembly space. In the present invention, implementation details and principles of the aforementioned steps will be described in detail one after another below with reference to FIG. 1 to FIG. 11.

Figure 2A:
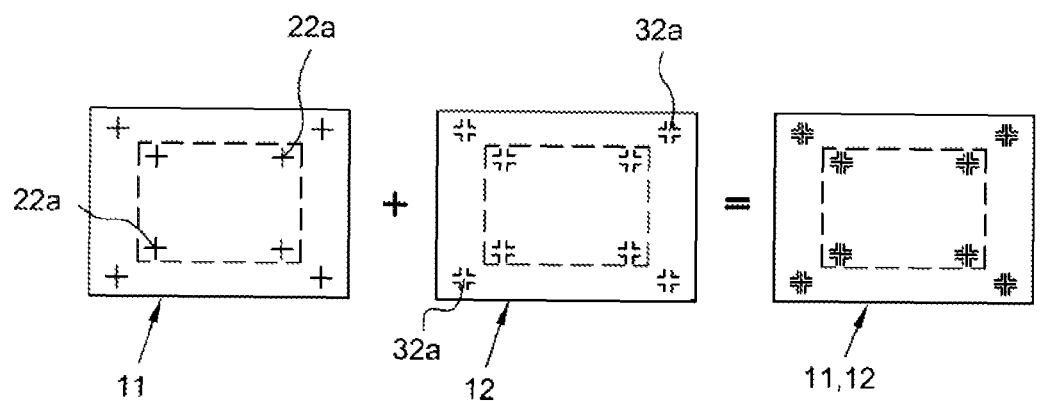
FIG. 2a is a planar schematic view of two calibration sheets according to an embodiment of the present invention.
Figure 2B:
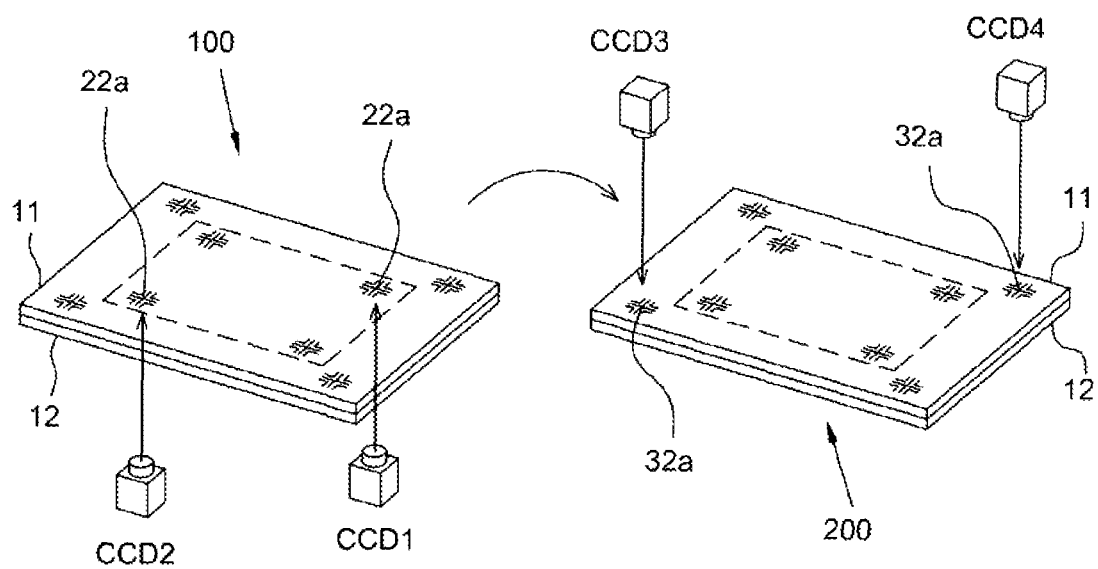
FIG. 2b is a perspective schematic view of two calibration sheets and four image capturing units according to an embodiment of the present invention.
Figure 3:
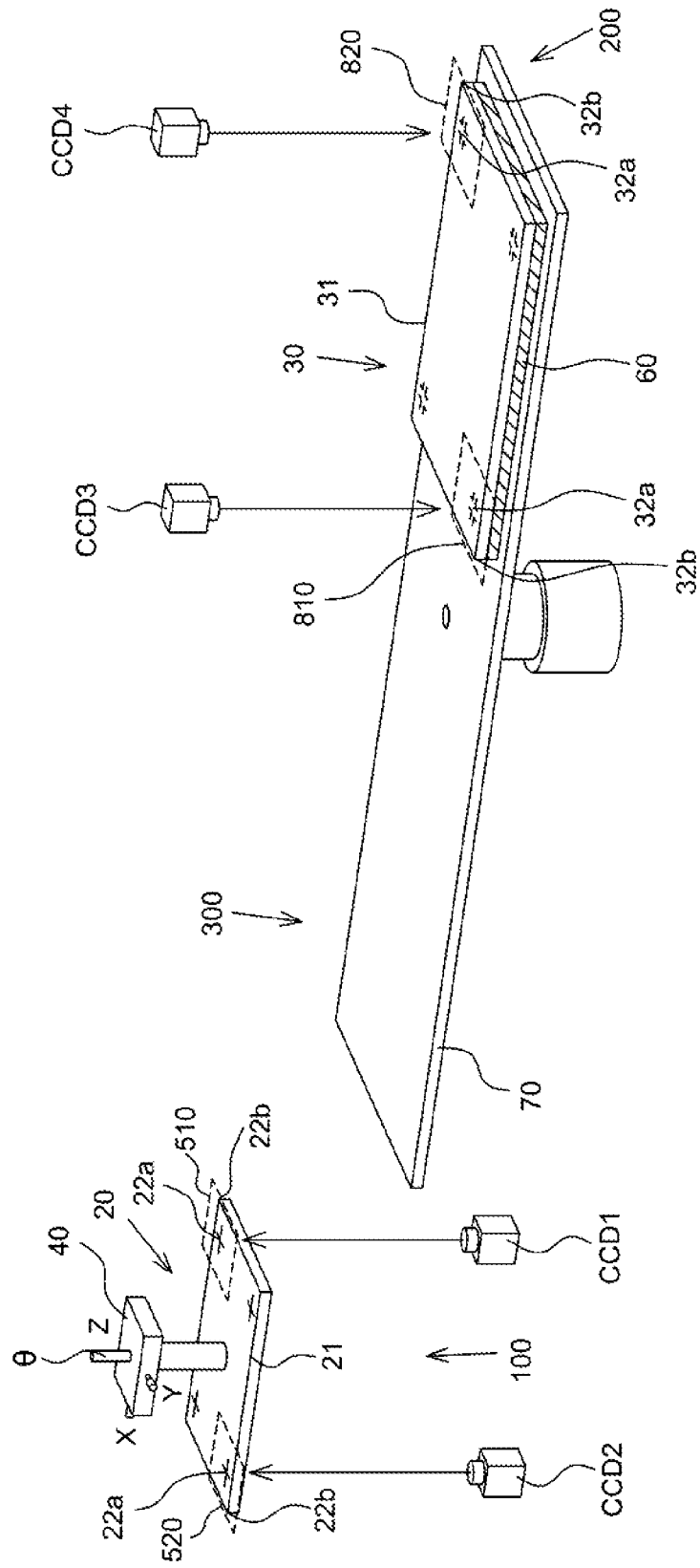
FIG. 3 is a perspective schematic view of an apparatus for aligning substrates in different spaces and having different sizes according to an embodiment of the present invention, showing specific marks (or specific shapes) in standard local feature regions of two substrates having different sizes.
Figure 4A:
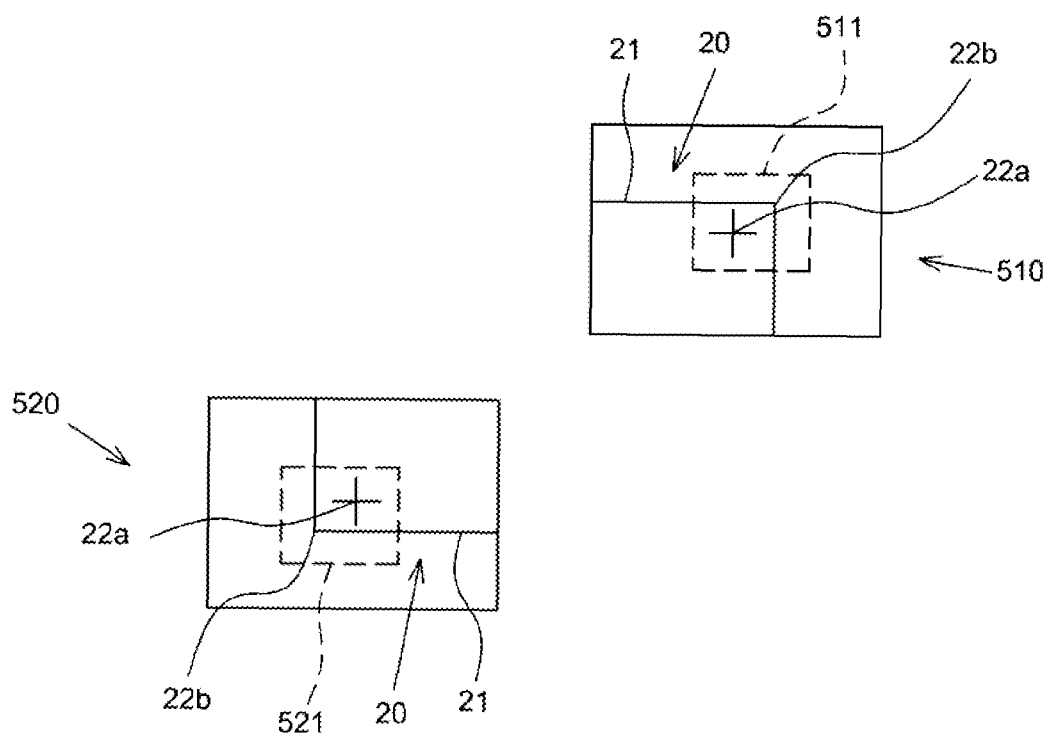
FIG. 4a is a planar schematic view of first standard local images according to an embodiment of the present invention.
Figure 4B:
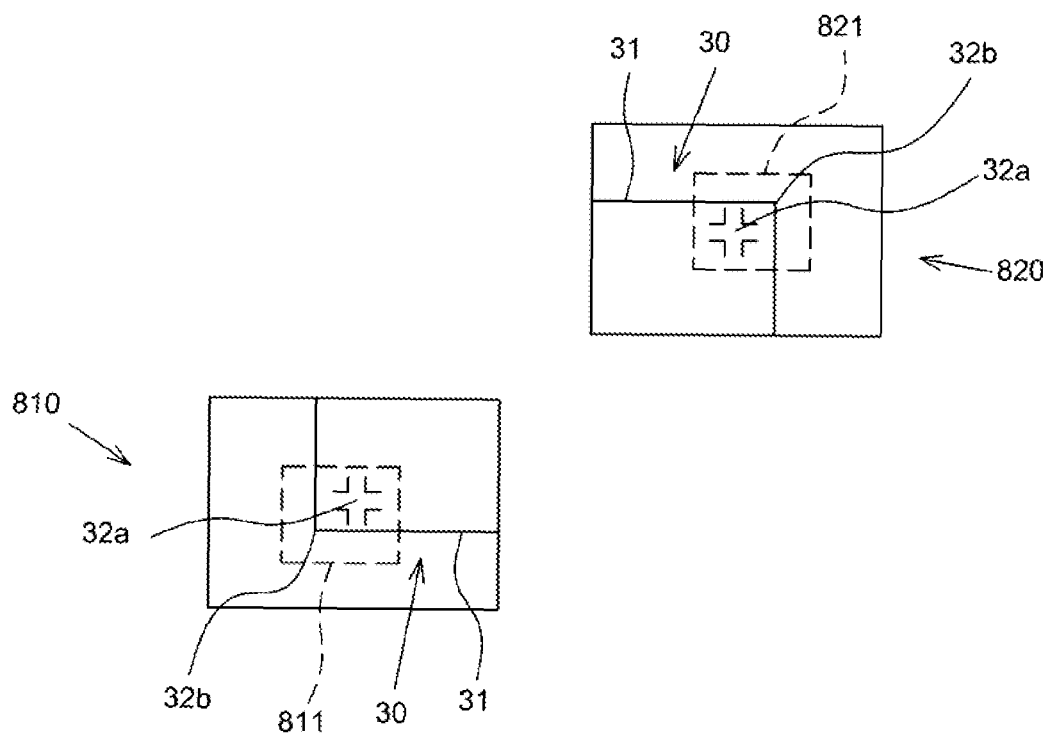
FIG. 4b is a planar schematic view of second standard local images according to an embodiment of the present invention.
Figure 5:
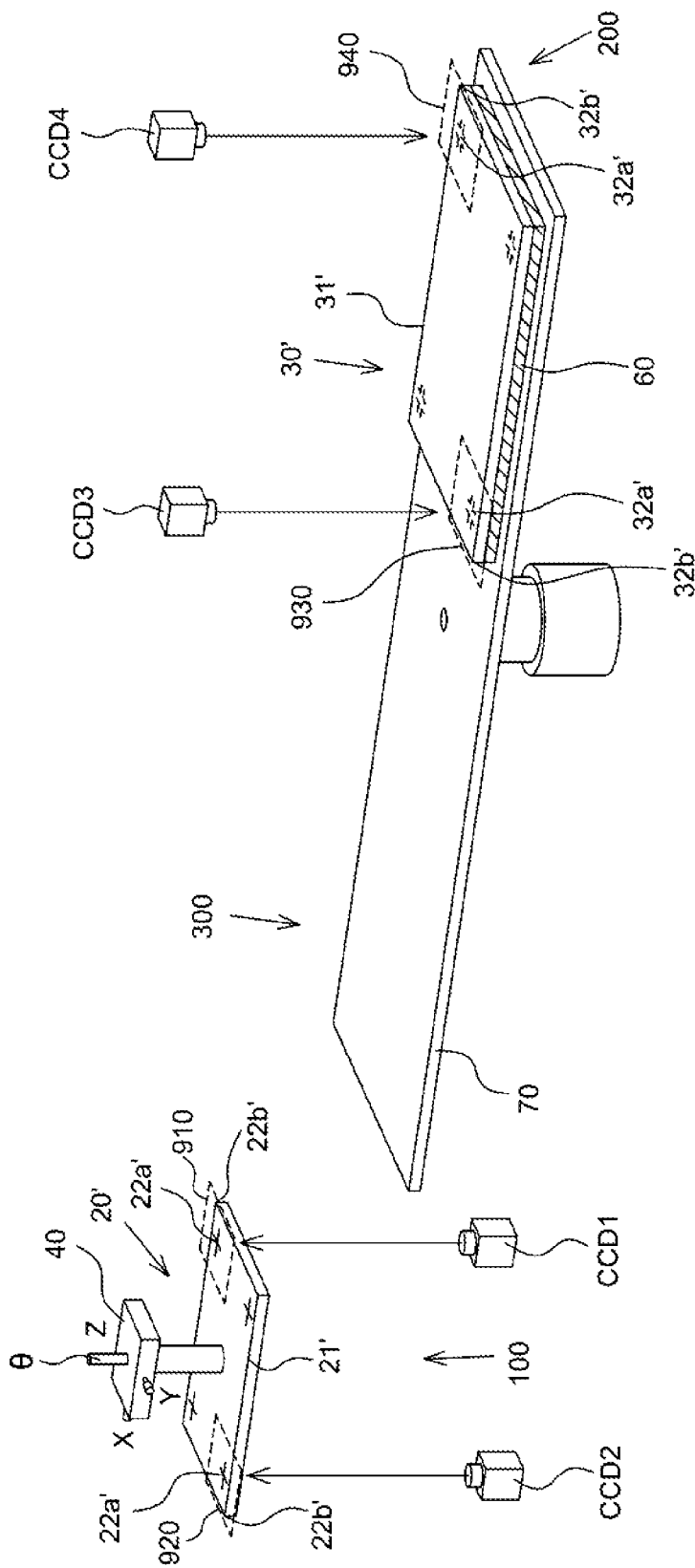
FIG. 5 is a perspective schematic view of an apparatus for aligning substrates in different spaces and having different sizes according to an embodiment of the present invention, showing at least two actual local images of two substrates in different waiting spaces.

Referring to FIG. 1a, FIG. 2a, and FIG. 2b, in Step (S01), spatial positions of two image capturing units in a first waiting space and two image capturing units in a second waiting space are pre-calibrated. In this embodiment, superimposed calibration sheets 11 and 12 are used to pre-calibrate two image capturing units CCD1 and CCD2 in a first waiting space 100 and two image capturing units CCD3 and CCD4 in a second waiting space 200. For example, referring to FIG. 2a, two calibration sheets 11 and 12 are superimposed, so that specific marks of the calibration sheets 11 and 12 are overlapped. The calibration sheets 11 and 12 may be transparent substrates, to make it convenient for the image capturing units CCD1, CCD2, CCD3, and CCD4 to capture images of the specific marks. The calibration sheets 11 and 12 include a dash-line-circled area that simulates a first substrate having a smaller size, for example, the dash-line-circled area is rectangular and has a first diagonal. The calibration sheets 11 and 12 include a solid-line-circled area that simulates a second substrate having a larger size, for example, the solid-line-circled area is rectangular and has a second diagonal. The second diagonal is longer than the first diagonal. The superimposed calibration sheets 11 and 12 are disposed above the two image capturing units CCD1 and CCD2 in the first waiting space 100, and the two image capturing units CCD1 and CCD2 are moved to capture specific marks 22a at two ends of the first diagonal of the dash-line-circled area of the superimposed calibration sheets 11 and 12 in the first waiting space 100, so as to calibrate positions of the two image capturing units CCD1 and CCD2 in the first waiting space 100. Then the superimposed calibration sheets 11 and 12 are disposed below two image capturing units CCD3 and CCD4 in the second waiting space 200, and the two image capturing units CCD3 and CCD4 are moved to capture specific marks 32a at two ends of the second diagonal of the solid-line-circled area of the superimposed calibration sheets 11 and 12 in the second waiting space 200, so as to calibrate positions of the two image capturing units CCD3 and CCD4 in the second waiting space 200. After the calibration, the image capturing units CCD1, CCD2, CCD3, and CCD4 are fixed.

Referring to FIG. 1a, FIG. 3, FIG. 4a, and FIG. 4b, in Step (S02), the two calibrated image capturing units in the first waiting space and the two calibrated image capturing units in the second waiting space are used to predefine specific marks (or specific shapes) in standard local feature regions of two substrates having different sizes. In this embodiment, a set of tri-axial movement mechanism 40 is used to fix a first substrate 20 in the first waiting space 100 by means of a vacuum suction nozzle or a clamping jaw (however, the first substrate 20 is not limited to being fixed by a vacuum suction nozzle or a clamping jaw). The tri-axial movement mechanism 40 is used for moving the first substrate 20 to an aligned assembly space 300 with a first predetermined amount of movement. Then, at least one set of load platform 60 and a load transfer mechanism are disposed in advance, wherein the load platform 60 is used for supporting a second substrate 30, and for fixing the second substrate 30 to the load transfer mechanism in the second waiting space 200 (however, the second substrate 30 is not limited to being fixed by the load platform). The load transfer mechanism may be a rotating platform 70. The rotating platform 70 is used for moving the load platform 60 and the second substrate 30 to the aligned assembly space 300 by rotating the load platform 60 and the second substrate 30 with a second predetermined amount of movement in a horizontal manner along an X/Y plane. In other applications, the load transfer mechanism may be a sliding platform, used for moving the load platform 60 and the second substrate 30 to the aligned assembly space 300 in a linear manner along an X/Y plane.

In this embodiment, the first substrate 20 can be, for example, selected from: one single-layer circuit substrate of a multilayer printed circuit board, a glass substrate of a liquid crystal panel module, a display frame, a touch panel, a liquid crystal panel, a glass photomask, a wafer, a piece of chemical test paper or a protection film, but is not limited thereto. A touch panel 21 is used as an example of the first substrate 20, and the touch panel 21 has a plurality of specific marks 22a (such as cross-line marks) or specific shapes 22b (such as right angle corners). Moreover, the second substrate 30 may be selected from another component correspondingly assembled to the first substrate 20. A liquid crystal panel 31 is used as an example of the second substrate 30; a size of the liquid crystal panel 31 is larger than a size of the touch panel 21, and the liquid crystal panel 31 has a plurality of specific marks 32a (such as cross-pipe marks) or specific shapes 32b (such as right angle corners). The second substrate 30 (liquid crystal panel) may be assembled with the first substrate 20 (such as a touch panel) to form a semi-finished touch display product.

The image capturing units CCD1 and CCD2 may be image capturing units in the form of charge coupled devices (CCDs) or complementary metal-oxide-semiconductor transistors (CMOSs). In this embodiment, the image capturing units CCD1 and CCD2 in the form of CCDs are used to capture first standard local images 510 and 520 of the first substrate 20. For example, the calibrated image capturing units CCD1 and CCD2 are already disposed below two end positions of a diagonal of the first substrate 20, so as to capture the first standard local images 510 and 520 of the first substrate 20. Then, the first standard local images 510 and 520 are transmitted to a near-end or remote image processing apparatus (which is not shown, and is, for example, a computer), and the image processing apparatus predefines a specific mark 22a (or specific shape 22b) of each of first standard local feature regions 511 and 521 at each of the first standard local images 510 and 520, and stores shape feature data of the specific marks 22a (or specific shapes 22b).

In addition, the two image capturing units CCD3 and CCD4 may also be image capturing units in the form of CCDs or CMOSs. In this embodiment, the image capturing units CCD3 and CCD4 in the form of CCDs are used to capture second standard local images 810 and 820 of the second substrate 30. For example, the calibrated image capturing units CCD3 and CCD4 are already disposed above two end positions of a diagonal of the second substrate 30, so as to capture the second standard local images 810 and 820 of the second substrate 30. Then, the second standard local images 810 and 820 are transmitted to the same image processing apparatus, and the image processing apparatus predefines a specific mark 32a (or specific shape 32b) of each of second standard local feature regions 811 and 821 at each of the second standard local images 810 and 820, and stores shape feature data of the specific marks 32a (or specific shapes 32b).

Step (S01) and Step (S02) need to be finished before the assembly is started, and are aimed at pre-calibrating spatial positions of the four image capturing units CCD1, CCD2, CCD3, and CCD4, and storing shape feature data of the specific marks 22a (or specific shapes 22b) of the first standard local feature regions 511 and 521 and shape feature data of the specific marks 32a (or specific shapes 32b) of the second standard local feature regions 811 and 821, so as to provide reference for image comparison during alignment after Step (S03).

Referring to FIG. 1a, FIG. 5, FIG. 6a, and FIG. 6b, in Step (S03), at least two actual local images of each of the two substrates in the first and second waiting space are captured by using the two calibrated image capturing units in the first waiting space and the two calibrated image capturing units in the second waiting space. In this embodiment, a first substrate 20' (such as a touch panel 31') to be aligned is suctioned or clamped below the tri-axial movement mechanism 40 and is located in the first waiting space 100. At the same time, the second substrate 30' (such as a liquid crystal panel 31') is disposed on the load platform 60 of the rotating platform 70 in the second waiting space 200. The first waiting space 100 and the second waiting space 200 are spaced by a distance, and the aligned assembly space 300 is provided between the first waiting space 100 and the second waiting space 200.

Then, two first actual local images 910 and 920 of the first substrate 20' are captured by using the two image capturing units CCD1 and CCD2. For example, during assembly, the two first actual local images 910 and 920 of the first substrate 20' to be aligned are captured by using the two image capturing units CCD1 and CCD2 which are the same as those used in Step (S02).

At the same time, two second actual local images 930 and 940 of the second substrate 30' are also captured by using the two image capturing units CCD3 and CCD4. For example, during assembly, the two second actual local images 930 and 940 of the second substrate 30' to be aligned are captured by using the two image capturing units CCD3 and CCD4 which are the same as those used in Step (S02).

Referring to FIG. 1a, FIG. 4a, FIG. 4b, FIG. 6a, and FIG. 6b again, in Step (S04), comparison is separately made with specific marks (or specific shapes) in standard local feature regions of each of the two substrates, and specific marks (or specific shapes) in at least two actual local feature regions of each of the two substrates are obtained. In this embodiment, the two first actual local images 910 and 920 are transmitted together to the same image processing apparatus (such as a computer), and the image processing apparatus compares the first actual local images 910 and 920 with the shape feature data of the specific marks 22a or specific shapes 22b of the standard local feature regions 511 and 521, to obtain specific marks 22a' (such as cross-line marks) or specific shapes 22b' (such as right angle corners) of the first actual local images 910 and 920 which are matched with two first actual local feature regions 911 and 921 of the first standard local feature regions 511 and 521, and stores shape feature data of the specific marks 22a' or specific shapes 22b' for later use.

At the same time, the two second actual local images 930 and 940 are transmitted together to the same image processing apparatus, and the image processing apparatus compares the second actual local images 930 and 940 with the shape feature data of the specific marks 32a (or specific shapes 32b) of the second standard local feature regions 811 and 821, to obtain specific marks 32a' (such as cross-pipe marks) or specific shapes 32b' (such as right angle corners) of the second actual local images 930 and 940 which are matched with two second actual local feature regions 931 and 941 of the second standard local feature regions 811 and 821, and stores shape feature data of the specific marks 32a' or specific shapes 32b' for later use.

Figure 6A:
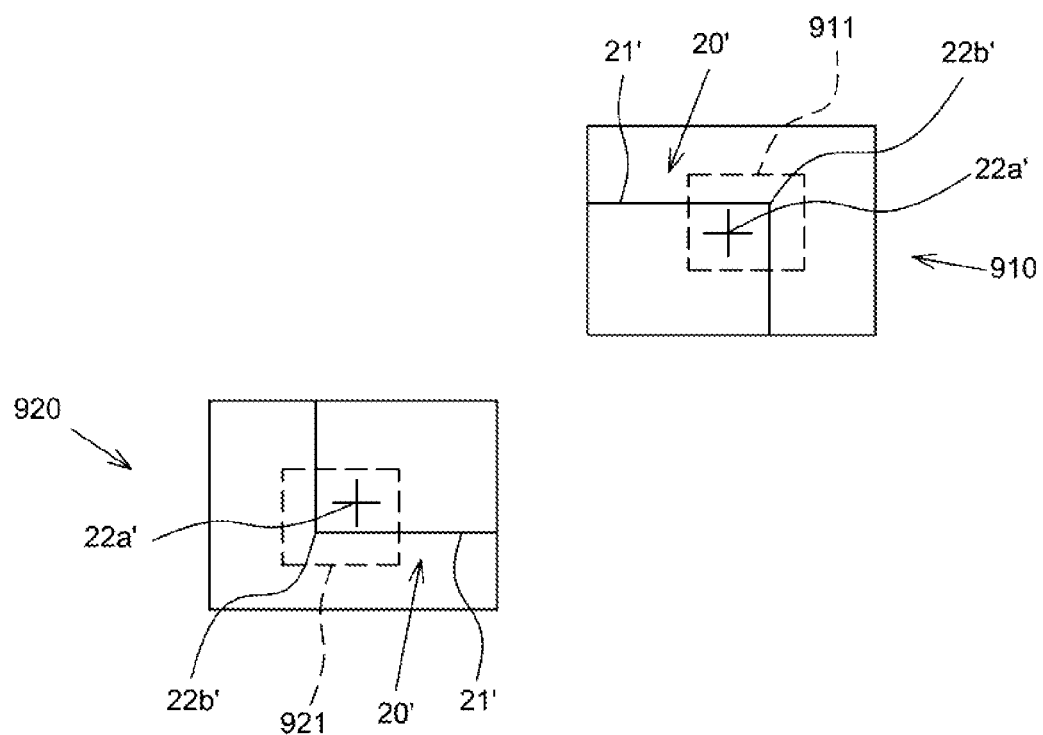
FIG. 6a is a planar schematic view of first actual local images according to an embodiment of the present invention.
Figure 7A:
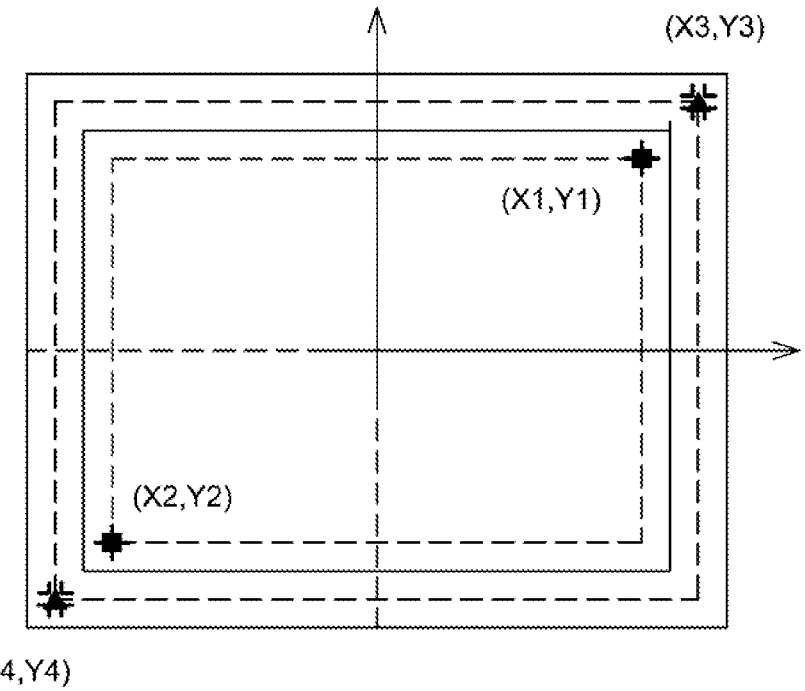
FIG. 7a is a planar schematic view of an aligned assembly coordinate system according to an embodiment of the present invention, showing coordinate values (X1, Y1) and (X2, Y2) of specific marks and coordinate values (X3, Y3) and (X4, Y4) of specific marks.
Figure 7B:
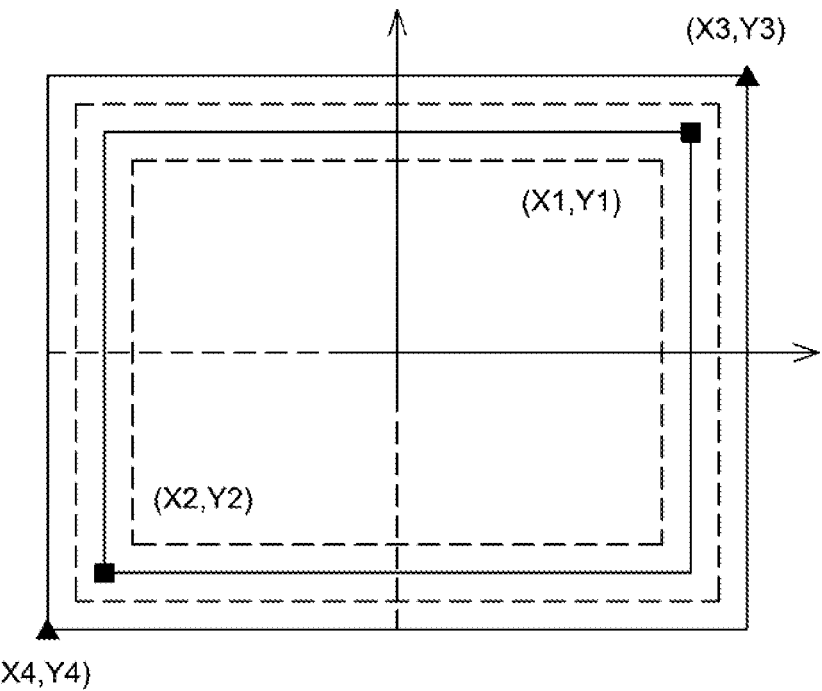
FIG. 7b is a planar schematic view of an aligned assembly coordinate system according to an embodiment of the present invention, showing coordinate values (X1, Y1) and (X2, Y2) of specific shapes and coordinate values (X3, Y3) and (X4, Y4) of specific shapes.

Referring to FIG. 1a, FIG. 7a, and FIG. 7b, in Step (S05), actual coordinate systems of the two substrates are established separately, so as to synthesize an aligned assembly coordinate system. Referring to FIG. 6a and FIG. 7a again, in this embodiment, the same image processing apparatus (such as a computer) may be used for calculation, to obtain center coordinate values (X1,Y1) and (X2,Y2) (namely, first square virtual black points) of the specific marks 22a' of the first actual local feature regions 911 and 921, so as to establish a first actual coordinate system of the first substrate 20'. Referring to FIG. 6a and FIG. 7b again, in another embodiment, the same image processing apparatus (such as a computer) may be used for calculation, to obtain center coordinate values (X1, Y1) and (X2, Y2) (namely, first square virtual black points) of the specific shapes 22b' of the first actual local feature regions 911 and 921, so as to establish a first actual coordinate system of the first substrate 20'. The first actual coordinate system of the first substrate 20' may be established by using the coordinate values (X1,Y1) and (X2,Y2).

Figure 6B:
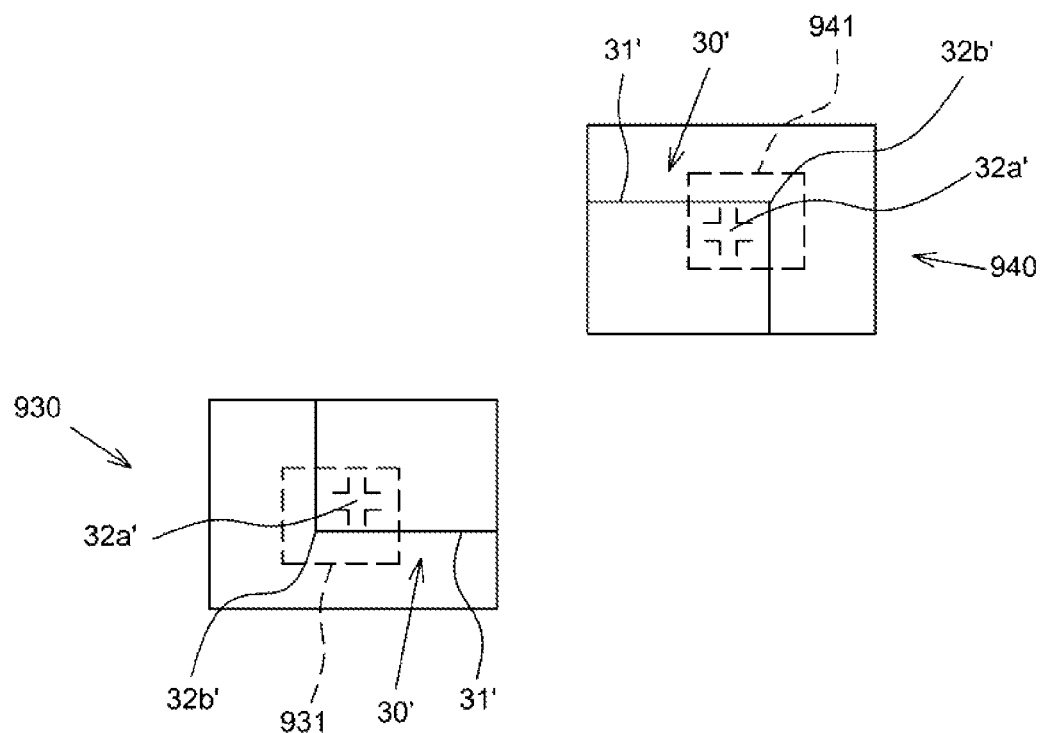
FIG. 6b is a planar schematic view of second actual local images according to an embodiment of the present invention.

At the same time, referring to FIG. 6b and FIG. 7a again, in this embodiment, the present invention may also use the same image processing apparatus (such as the computer) for calculation, to obtain center coordinate values (X3,Y3) and (X4, Y4) (namely, triangular virtual black points) of the specific marks 32a' of the second actual local feature regions 931 and 941, so as to establish a second actual coordinate system of the second substrate 30'. Finally, the first and second actual coordinate systems are synthesized to form an aligned assembly coordinate system. Referring to FIG. 6b and FIG. 7b again, in another embodiment, the same image processing apparatus (such as the computer) may be used for operation, to obtain center coordinate values (X3, Y3) and (X4, Y4) (namely, triangular virtual black points) of the specific shapes 32b' of the first actual local feature regions 911 and 921, so as to establish a first actual coordinate system of the second substrate 30'. The second actual coordinate system of the second substrate 30' may be established by using the coordinate values (X3, Y3) and (X4, Y4). Finally, the first and second actual coordinate systems are synthesized to form an aligned assembly coordinate system.

Referring to FIG. 1a, FIG. 7a, and FIG. 7b, in Step (S06), coordinate values of the specific marks (or specific shapes) of the two substrates in the two actual coordinate systems are compared so as to obtain a first group of offsets, and sizes of the two substrates are compared so as to obtain a size difference. In this embodiment, when the coordinate values (X1, Y1) and (X2,Y2) of the specific marks (or specific shapes) of the first substrate 20' in the first actual coordinate system are compared with the coordinate values (X3, Y3) and (X4, Y4) of the specific marks (or specific shapes) of the second substrate 30' in the second actual coordinate system, a first group of offsets ΔX1, ΔY1, and Δθ1 for required displacements in X and Y axial directions and a rotation angle θ are obtained for compensating visual differences of the image capturing units in the first and second waiting spaces.

Referring to FIG. 1b, FIG. 6a, FIG. 6b, FIG. 8a, and FIG. 8b, in Step (S07), the first group of offsets and the size difference are used to correct coordinate values of specific marks (or specific shapes) of one of the two substrates. In this embodiment, the same image processing apparatus (such as the computer) may be used for calculation, and the first group of offsets and the size difference are used to correct the center coordinate values (X1,Y1) and (X2,Y2) of the specific marks 22a' (or specific shapes 22b') of the first actual local feature regions 911 and 921 of the first substrates 20' to be (X1',Y1') and (X2',Y2') (namely, second square virtual black points), so that in the aligned assembly coordinate system, the corrected center coordinate values (X1', Y1') and (X2', Y2') of the specific marks 22a' (or specific shapes 22b') of the first substrate 20' are close to the center coordinate values (X3,Y3) and (X4,Y4) (namely, triangular virtual black points) of the specific marks 32a' (or specific shapes 32b') of the second substrate 30'.

Figure 8A:
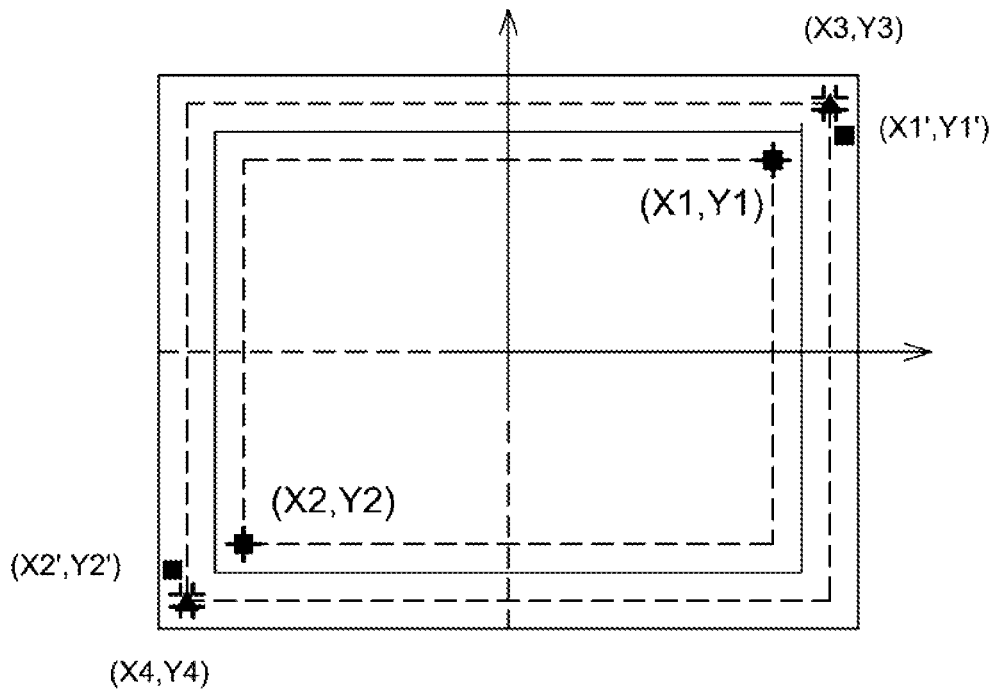
FIG. 8a is a planar schematic view of an aligned assembly coordinate system according to an embodiment of the present invention, which shows corrected coordinate values (X1', Y1') and (X2', Y2') of specific marks and coordinate values (X3, Y3) and (X4, Y4) of specific marks.
Figure 8B:
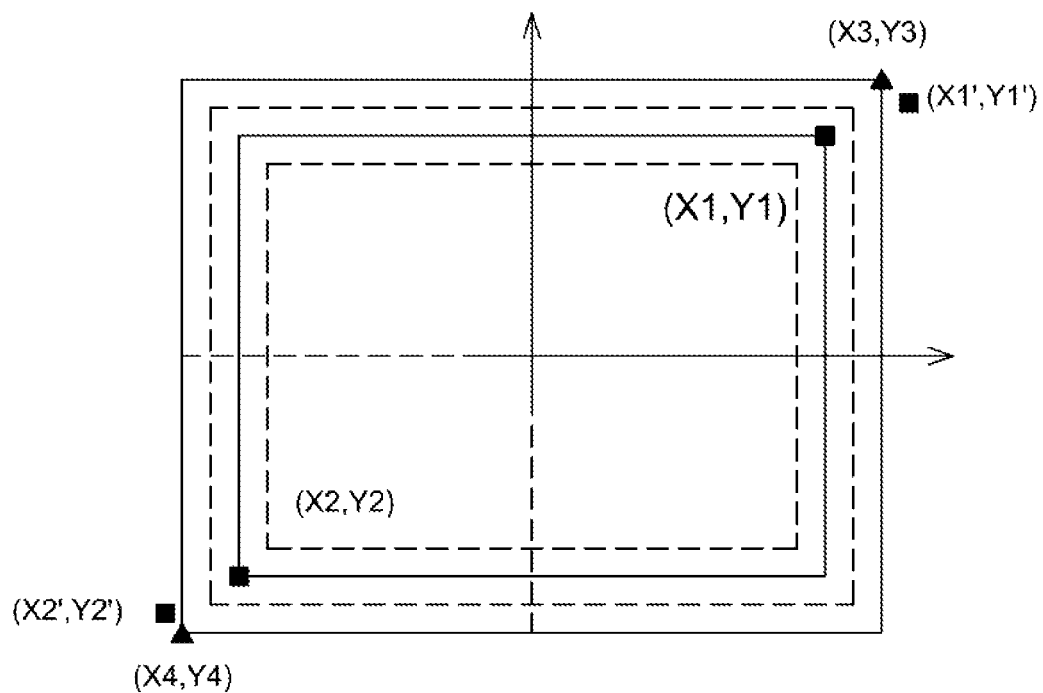
FIG. 8b is a planar schematic view of an aligned assembly coordinate system according to an embodiment of the present invention, which shows corrected coordinate values (X1', Y1') and (X2', Y2') of specific shapes and coordinate values (X3, Y3) and (X4, Y4) of specific shapes.

Referring to FIG. 1b, FIG. 8a, and FIG. 8b again, in Step (S08), the corrected coordinate values of the specific marks (or specific shapes) of the one of the two substrate in the two actual coordinate systems are compared with the coordinate values of the specific marks (or specific shapes) of the other one of the two substrates, so as to obtain a second group of offsets. In this embodiment, when the corrected center coordinate values (X1', Y1') and (X2', Y2') of the specific marks (or specific shapes) of the first substrate 20' in the first actual coordinate system are compared with the center coordinate values (X3,Y3) and (X4,Y4) of the specific marks (or specific shapes) of the second substrate 30' in the second actual coordinate system, a second group of offsets ΔX3, ΔY3, and Δθ3 for required displacements in X and Y axial directions and a rotation angle are obtained for compensating visual differences of the image capturing units in the first and second waiting spaces.

Figure 9:
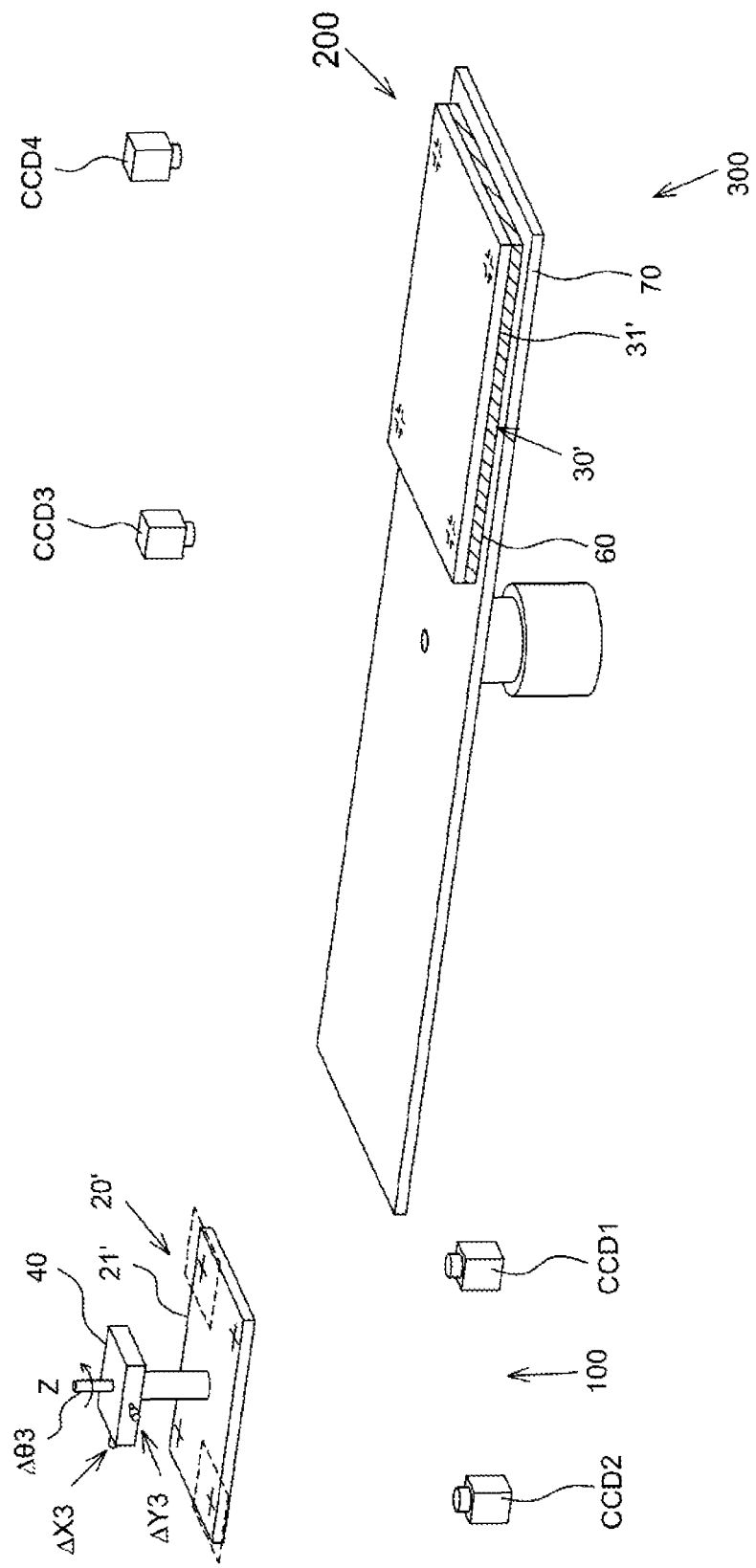
FIG. 9 is a perspective schematic view of an apparatus for aligning substrates in different spaces and having different sizes according to an embodiment of the present invention, showing the movement of the one of two substrates to a position compensated by the second group of offsets.

Further referring to FIG. 1b and FIG. 9, in Step (S09), the one of the two substrates is moved to a position compensated by the second group of offsets. In this embodiment, according to the second group of offsets obtained in Step (S08), the tri-axial movement mechanism 40 moves the first substrate 20' to the position compensated by the second group of offsets. The second group of offsets ΔX3, ΔY3, and Δθ3 in the present invention does not include a first predetermined amount of movement ΔX1' and a second predetermined amount of movement ΔX2', wherein the first predetermined amount of movement ΔX1' is in the X axial direction for moving the first substrate 20' from the first waiting space 100 to the aligned assembly space 300, and the second predetermined amount of movement ΔX2' is in the X axial direction required for moving the second substrate 30' from the second waiting space 200 to the aligned assembly space 300, that is to say, a position difference value between the first actual coordinate system of the first substrate 20' and the second actual coordinate system of the second substrate 30' along the X axial direction is actually ΔX3+ΔX1'+≠X2', but when the first substrate 20' is moved along the X axial direction from the first actual coordinate system 100 to the aligned assembly space 300, the offsets ΔX3+ΔX1' needs to be used.

In Step (S10), it is determined whether the second group of offsets is less than an expected target value. In this embodiment, if the second group of offsets is not less than the expected target value, the aligning method returns to Step (S08); on the contrary, if the second group of offsets is less than the expected target value, the aligning method proceeds to next step (S11).

Figure 10:
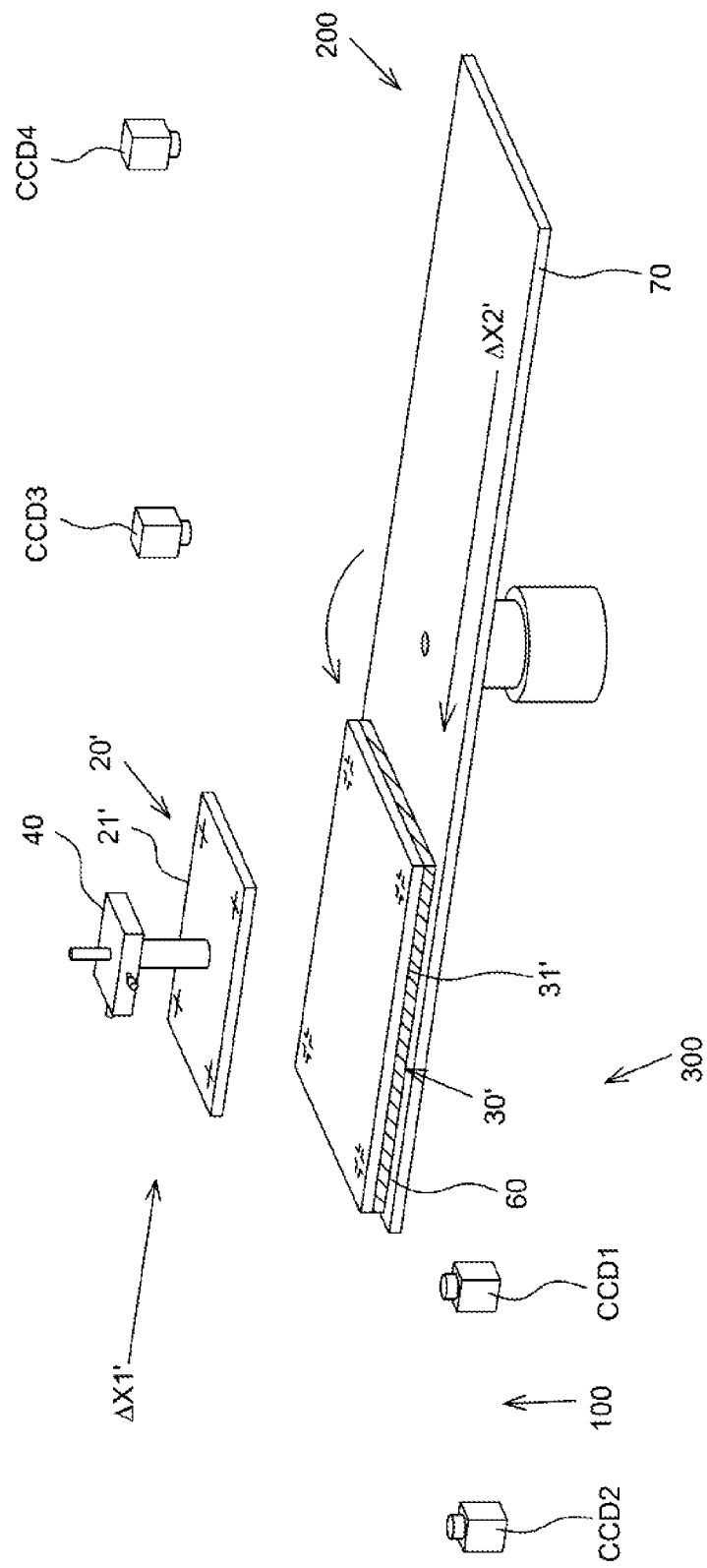
FIG. 10 is a perspective schematic view of an apparatus for aligning substrates in different spaces and having different sizes according to an embodiment of the present invention, showing that two substrates are moved respectively from their waiting spaces into an aligned assembly space.
Figure 11:
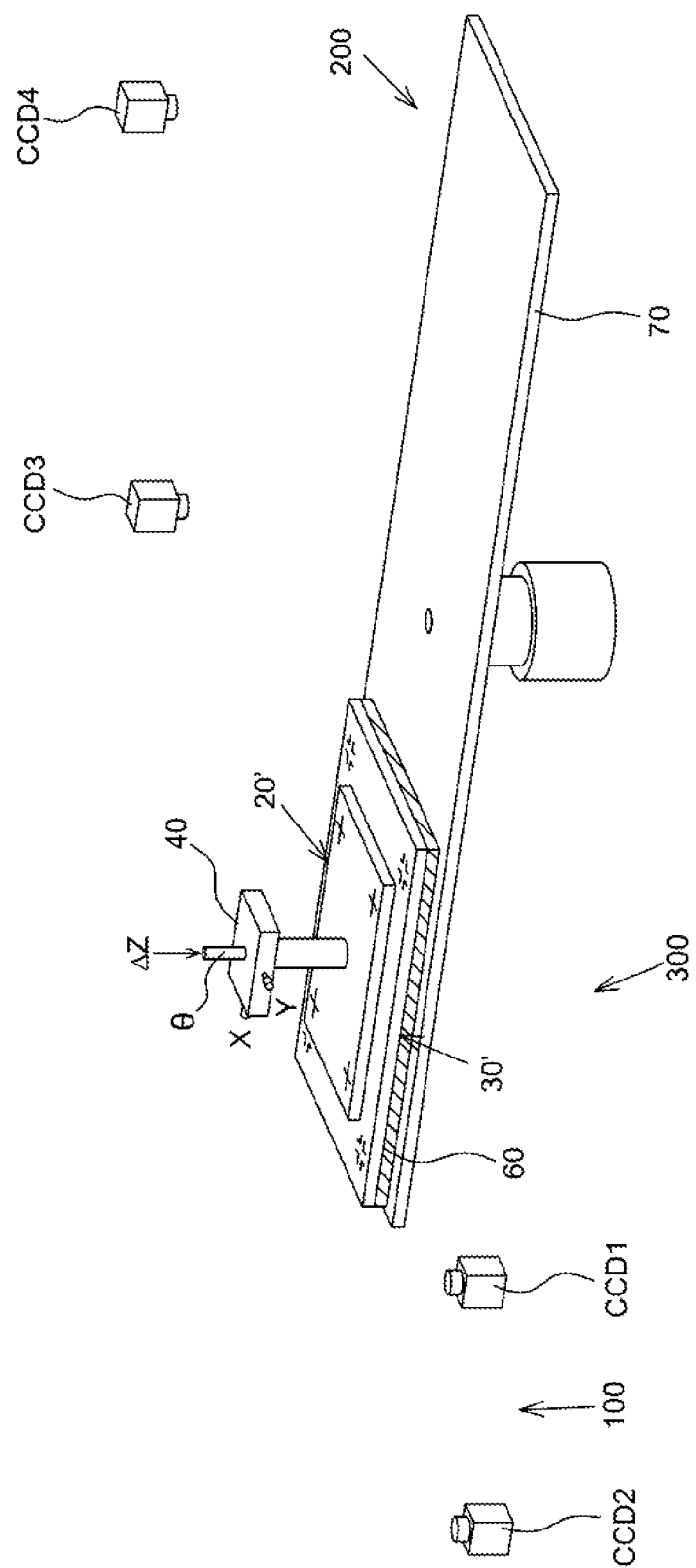
FIG. 11 is a perspective schematic view of an apparatus for aligning substrates in different spaces and having different sizes according to an embodiment of the present invention, showing the aligned assembly of the two substrates in an aligned assembly space.

Referring to FIG. 1b and FIG. 10, in Step (S11), the one of the two substrates is moved from the first waiting space to an aligned assembly space by using a first predetermined amount of movement. In this embodiment, the tri-axial movement mechanism 40 is used to move the first substrate 20' from the first waiting space 100 to the aligned assembly space 300. According to the first predetermined amount of movement ΔX1', the tri-axial movement mechanism 40 moves the first substrate 20' to a position to be assembled in the aligned assembly space 300.

Further referring to FIG. 1b and FIG. 10, in Step (S12), the other one of the two substrates is moved from the second waiting space to the aligned assembly space by using a second predetermined amount of movement. In this embodiment, the rotating platform 70 may be used to move the load platform 60 and second substrate 30' from the second waiting space 200 to the aligned assembly space 300 by rotating the load platform 60 and second substrate 30' in a horizontal manner along an X/Y plane. According to the second predetermined amount of movement ΔX2', the rotating platform 70 moves the second substrate 30' to another position to be assembled (for example, the position is right below or right above the first substrate 20' along the Z axis) in the aligned assembly space 300, so that the second substrate 30' waits to be assembled.

Referring to FIG. 1b and FIG. 10 again, in Step (S13), aligned assembly of the two substrates is completed in the aligned assembly space. In this embodiment, the tri-axial movement mechanism 40 may move the first substrate 20' along the Z axis for a predetermined amount of movement ΔZ (for example, moving the first substrate 20' downward vertically for a predetermined distance), until aligned assembly with the second substrate 30' on the load platform 60 in the aligned assembly space 300 is completed. In this way, the aligned assembly task of the first substrate 20' and the second substrate 30' is completed.

The aligning method according to the present invention is applicable to alignment of two substrates, with or without marks, in different waiting spaces and having different sizes. When two substrates are located in different waiting spaces, coordinate values of the specific marks (or specific shapes) of the two substrates are subsequently calculated by using specific marks (or specific shapes) of actual local feature regions of the two substrates. Coordinate values of specific marks (or specific shapes) of one substrate of the two substrates are corrected, so that the two substrates having different sizes are taken as two substrates having identical sizes by means of simulation. Then, the deviation of the alignment of the substrates in different spaces and having different sizes is compensated and corrected, and a post process (such as attachment or assembly) is performed subsequently. It is unnecessary to establish a complex transformation relationship between an image coordinate system and an aligned coordinate system, and therefore mathematic calculations can be reduced by a great degree, a device debugging time can be reduced, and an aligned attachment process can be more flexible.

Unlike the conventional method, the aligning method for substrates in different spaces and having different sizes according to the present invention can solve the problem that substrates having different sizes cannot be precisely aligned and attached during processes. The aligning method for substrates in different spaces and having different sizes according to the present invention is applicable to various high-tech industries, such as a touch panel industry. During a attachment process involving multiple layers that are of different types and have different sizes, this aligning method can solve the problem that images of substrates in different spaces and having different sizes cannot be aligned, thereby improving the production speed and flexibility of the process.

Described in the foregoing are merely implementation manners or embodiments for presenting the technical means employed in the present invention for solving the problems, and these implementation manners or embodiments are not intended to limit the implementation scope of the present invention patent. Any equivalent change and modification made in consistency with the content of the scope of the present invention patent application or in accordance with the scope of the present invention patent shall fall within the scope of the present invention patent.

What is claimed is:

1. A method for aligning substrates in different spaces and having different sizes, comprising following steps of:
    capturing at least two actual local images of each of two substrates in a first waiting space and a second waiting space and having different sizes by using two calibrated image capturing units in the first waiting space and two calibrated image capturing units in the second waiting space;
    separately making comparison with specific marks or specific shapes in standard local feature regions of each of the two substrates, and obtaining specific marks or specific shapes in at least two actual local feature regions of each of the two substrates;
    separately establishing actual coordinate systems of the two substrates so as to synthesize an aligned assembly coordinate system;
    comparing coordinate values of the specific marks or specific shapes of the two substrates in the two actual coordinate systems so as to obtain a first group of offsets, and comparing sizes of the two substrates so as to obtain a size difference;

correcting coordinate values of specific marks or specific shapes of one of the two substrates by using the first group of offsets and the size difference;

comparing the corrected coordinate values of the specific marks or specific shapes of the one of the two substrates in the two actual coordinate systems with coordinate values of specific marks or specific shapes of the other one of the two substrates, so as to obtain a second group of offsets;

moving the one of the two substrates to a position compensated by the second group of offsets;

moving the one in the two substrates from the first waiting space to an aligned assembly space by using a first predetermined amount of movement; and moving the other one of the two substrates from the second waiting space to the aligned assembly space by using a second predetermined amount of movement.

2. The method for aligning substrates in different spaces and having different sizes according to claim 1, further comprising a following step of:

pre-calibrating spatial positions of the two image capturing units in the first waiting space and the two image capturing units in the second waiting space.

3. The method for aligning substrates in different spaces and having different sizes according to claim 2, further comprising a following step of:

predefining the specific marks or specific shapes in the standard local feature regions of the two substrates having different sizes by using the two calibrated image capturing units in the first waiting space and the two calibrated image capturing units in the second waiting space.

4. The method for aligning substrates in different spaces and having different sizes according to claim 3, further comprising a following step of:

determining whether the second group of offsets is less than an expected target value.

5. The method for aligning substrates in different spaces and having different sizes according to claim 4, further comprising a following step of:

completing aligned assembly of the two substrates in the aligned assembly space.

6. The method for aligning substrates in different spaces and having different sizes according to claim 2, wherein the step of pre-calibrating spatial positions of the two image capturing units in the first waiting space and the two image capturing units in the second waiting space comprises following steps of:

superimposing two calibration sheets, so that specific marks of the calibration sheets are overlapped;

disposing the superimposed calibration sheets above first and second image capturing units in the first waiting space, and moving the first and second image capturing units to capture specific marks at two ends of a first diagonal of a dash-line-circled area of the superimposed calibration sheets in the first waiting space, so as to calibrate positions of the first and second image capturing units in the first waiting space;

disposing the superimposed calibration sheets below third and fourth image capturing units in the second waiting space, and moving the third and fourth image capturing units to capture specific marks at two ends of a second diagonal of a dash-line-circled area of the superimposed calibration sheets in the second waiting space, so as to calibrate positions of the third and fourth image capturing units in the second waiting space; and fixing the calibrated first to fourth image capturing units.

7. The method for aligning substrates in different spaces and having different sizes according to claim 1, wherein the specific marks of the one of the two substrates are cross-line marks, and the specific marks of the other one of the two substrates are cross-pipe marks.

8. The method for aligning substrates in different spaces and having different sizes according to claim 1, wherein the specific shapes of the one in the two substrates are right angle corners, and the specific shapes of the other one of the two substrates are right angle corners.

9. The method for aligning substrates in different spaces and having different sizes according to claim 1, wherein the second group of offsets are used for compensating displacements in X and Y axial directions and a rotation angle that are required by a visual difference of the image capturing units in the first and second waiting spaces.

* * * * *